United States Patent
Hawryluk

(10) Patent No.: US 6,303,917 B1
(45) Date of Patent: Oct. 16, 2001

(54) RADIANT ENERGY MONITORING APPARATUSES INCLUDING A CALIBRATION OPERATION AND RELATED METHODS

(75) Inventor: Andrew M. Hawryluk, Los Altos Hills, CA (US)

(73) Assignee: Ultratech Stepper, Inc., San Jose, CA (US)

( * ) Notice: Subject to any disclaimer, the term of this patent is extended or adjusted under 35 U.S.C. 154(b) by 0 days.

(21) Appl. No.: 09/311,935

(22) Filed: May 14, 1999

(51) Int. Cl.[7] .................................................. G01J 1/32
(52) U.S. Cl. .............................................. 250/205; 250/216
(58) Field of Search ................................ 250/205, 214 R, 250/214 AL, 216, 548, 201.5; 356/73, 399–401

(56) References Cited

U.S. PATENT DOCUMENTS

| | | | |
|---|---|---|---|
| 4,433,235 | * 2/1984 | Akiyama et al. | 250/205 |
| 4,689,482 | 8/1987 | Horikawa et al. | 250/205 |
| 5,004,338 | 4/1991 | Morrow . | |
| 5,122,635 | 6/1992 | Knodler et al. . | |
| 5,430,816 | 7/1995 | Furuya et al. | 385/33 |
| 5,529,630 | 6/1996 | Imahashi et al. . | |
| 5,580,471 | 12/1996 | Fukumoto et al. | 219/121.63 |
| 5,581,075 | * 12/1996 | Naraki et al. | 250/205 |
| 5,751,423 | 5/1998 | Traina et al. | 356/338 |
| 5,754,571 | 5/1998 | Endoh et al. | 372/20 |
| 5,755,512 | 5/1998 | White | 374/161 |
| 5,798,518 | * 8/1998 | Coleman et al. | 250/205 |

* cited by examiner

Primary Examiner—Que T. Le
(74) Attorney, Agent, or Firm—Allston L. Jones

(57) ABSTRACT

The invented apparatus can be used to monitor the radiant energy delivered to a substrate for treatment thereof. The radiant energy can be laser light or light generated by a flash-lamp, for example. The apparatus includes an energy-tapping member such as a beam splitter, that is positioned between a source and optical element(s) used to generate and modify radiant energy, and a substrate to be treated with the radiant energy. The energy-tapping member receives radiant energy from the source and optical element(s), and divides the radiant energy from the source and optical element(s) into two portions. The first portion of radiant energy travels from the energy-tapping member to the substrate for treatment thereof. The apparatus includes an energy sensor such as a photodiode, arranged to receive the second portion of radiant energy. The energy sensor generates a signal indicative of the radiant energy supplied to the substrate. The energy-tapping member is preferably positioned optically downstream from the optical element(s) as the last or near last element encountered by the radiant energy. As so positioned, thermal or mechanical drifts in the optical element(s) have little or no impact on the ability of the invented apparatus to determine the amount of radiant energy supplied to the substrate. The apparatus can include a processing unit coupled to receive the sensor signal, which integrates the sensor signal to generate a signal indicative of the amount of radiant energy supplied to the substrate. The processing unit can also generate a visual display of the amount of radiant energy supplied to the substrate. The invention also includes related methods.

42 Claims, 7 Drawing Sheets

RADIANT ENERGY MONITORING APPARATUSES INCLUDING A CALIBRATION OPERATION AND RELATED METHODS

GOVERNMENT RIGHTS

This invention was made with Government support contract number N66001-95-C-8002 awarded by the Space and Naval Warfare Systems Command, San Diego. The Government has certain rights in the invention.

BACKGROUND OF THE INVENTION

1. Field of the Invention

This invention is directed to apparatuses and methods for monitoring radiant energy delivered to a substrate. The radiant energy can be generated by a laser or flash lamp, for example. The apparatuses and methods of the invention can be used to monitor radiant energy supplied to a substrate to anneal integrated devices or circuits formed thereon, or to expose a resist layer in the performance of photolithography. The apparatuses and methods can also be used to monitor radiant energy supplied to heat a substrate to form silicide contacts coupling source/drain or gate contacts to conductive metal lines or wiring. In addition, the apparatuses and methods can be used to monitor radiant energy that triggers a chemical reaction to deposit reactant products onto a substrate, or conversely, to remove material from a substrate, for example.

2. Description of the Related Art

FIG. 1 is a general diagram of a previous device 1 for monitoring the amount of energy delivered to a substrate 2. The device 1 generally includes a laser 3 generating radiant energy 4, a beam splitter 5, optical element(s) 6, a stage 7, and an energy detector 8. The radiant energy 4, i.e., laser light, is supplied to the beam splitter which reflects a portion of the incident radiant energy 4' to the optical element(s). The optical element(s) includes one or more mirrors or lenses which modify the radiant energy 4' in some predetermined fashion. For example, the optical element(s) can be used to focus the radiant energy 4' onto the substrate, or to magnify or reduce the radiant energy's image field. The optical element(s) directs the light to the substrate which is positioned on the stage. A portion of the radiant energy 4" generated by the laser is transmitted through the beam splitter and impinges on the energy detector. The device 1 monitors the amount of radiant energy 4' supplied to the substrate by determining the amount of radiant energy 4" received by the energy detector.

The proper functioning of the device 1 depends upon the assumption that the radiant energy 4" tapped upstream along the optical path from the optical element(s), is related in a fixed manner to the amount of radiant energy 4' supplied to the substrate downstream along the optical path from the optical element(s). Although the amount of radiant energy 4" received by the energy detector may be related to the radiant energy 4' delivered to the substrate upon calibration of the device 1 and shortly thereafter, such relationship generally changes with time due to thermal or mechanical drifts of the optical element(s) or changes in the performance thereof. As a result, the actual amount of radiant energy 4' delivered to the substrate may be significantly different than expected, leading to over- or under-treatment of the substrate with the radiant energy 4' and consequent failure of the radiant-energy processing of the substrate. It would be desirable to overcome this disadvantage of previous devices and techniques used to monitor the radiant energy supplied to a substrate.

SUMMARY OF THE INVENTION

This invention has as its objects to overcome the disadvantages of previous devices and techniques as noted above, and does in fact overcome such disadvantages.

The invented apparatuses and methods can be used to monitor the radiant energy delivered to a substrate for treatment thereof. The apparatus can include a source for generating radiant energy. The source can be a laser or flash-lamp, for example. The apparatus also can include one or more optical elements such as a mirror(s), lens(es) or filter(s), for example, for modifying the radiant energy in a predetermined fashion. The apparatus includes an energy-tapping member which is positioned to receive the radiant energy from the optical element(s), and which divides the modified radiant energy into first and second portions. The first portion of radiant energy travels from the energy-tapping member to the substrate for treatment thereof. The apparatus also includes an energy sensor positioned to receive the second portion of the radiant energy from the energy-tapping member. The energy sensor generates a sensor signal indicative of the radiant energy supplied to the substrate, based on the second portion of radiant energy. Because the energy-tapping member is positioned downstream from the source and optical element(s) along the optical path traveled by the radiant energy, it should be appreciated that drift in the source or optical element(s) has no significant impact on the ability of the energy-tapping member and energy sensor to detect the radiant energy supplied to the substrate. Therefore, the apparatus can determine the amount of radiant energy supplied to the substrate with significantly greater accuracy as compared to previous devices.

The apparatus can further include a processing unit coupled to receive the sensor signal from the energy sensor. The processing unit can be implemented to relate sample data derived by sampling the sensor signal at a predetermined time increment, to energy data indicative of the first portion of radiant energy supplied to the substrate. The processing unit can use predetermined relationship data generated in a calibration mode of the apparatus to relate the sample data to corresponding energy data. In the operation mode, the processing unit uses the prestored relationship data to convert the sample data into energy data that indicates the radiant energy provided to the substrate over a predetermined time increment. The processing unit can use the energy data to generate a signal indicative of the radiant energy supplied to the substrate for corresponding sampling time increments. In addition, the processing unit can integrate the energy data to generate a signal indicative of the amount of energy supplied to the substrate in a single pulse or series of pulses of radiant energy generated by the source. The processing unit can also generate a display signal based on the energy data. The apparatus can include a display unit coupled to receive the display signal, to generate a visual display of the radiant energy supplied to the substrate, based on the display signal.

A method of this invention can include a step of generating and directing radiant energy to at least one optical element, and a step of modifying the radiant energy with the optical element. The method includes a step of dividing the radiant energy from the optical element into first and second portions. The first portion of the radiant energy travels to a substrate for treatment thereof. The method also includes a step of sensing the second portion of radiant energy, and generating a sensor signal indicative of the first portion of radiant energy supplied to the substrate, based on the sensed second portion of the radiant energy. The method can further include a step of integrating the sensor signal to generate a signal indicative of the amount of radiant energy supplied to the substrate. The method can also include a step of generating a display signal, based on the sensor signal, and a step of generating a visual display, based on the display signal.

These together with other features and advantages, which will become subsequently apparent, reside in the details of the invented apparatuses and methods as more fully hereinafter described and claimed, reference being made to the accompanying drawings, forming a part hereof wherein like numerals refer to like parts throughout the several views.

DESCRIPTION OF THE PREFERRED EMBODIMENTS

As used herein, the following terms have the following meanings:

"Calibration mode" refers to the preparation of the invented apparatus for operation by collecting and storing data establishing a relationship between a first portion of the radiant energy divided from the source radiant energy by the energy-tapping member and directed to the substrate, and a second portion of radiant energy divided from the source radiant energy by the energy-tapping member and directed to the energy sensor.

"Downstream" refers to a position spaced along the direction of propagation of the radiant energy through the apparatus (i.e., the optical path), from a particular point of reference on the optical path. "Downstream" can also refer to the direction of propagation of the radiant energy along the apparatus's optical path.

"Level" refers to the magnitude of voltage or current in the case of an electric signal, or the radiant energy or amount of radiant energy represented by such voltage or current.

"Operation mode" refers to the use of the invented apparatus to monitor the radiant energy delivered to a substrate.

"Optical length" is the distance multiplied by refractive index for the medium through which radiant energy travels from one point to another, summed if the radiant energy travels through different media.

"Optical path" refers to the path traveled by the radiant energy as it propagates through the apparatus.

"Preprogrammed" or "prestored" refer to storing data in the processing unit before the apparatus's operation mode.

"Processing" or "treating" as used herein are synonymous, and refer to affecting or inducing a change in the substrate or materials or layers formed thereon, through the use of radiant energy.

"Radiant energy" refers to any form of propagating energy, including laser light or light generated by a flashlamp, for example.

"Upstream" refers to a position that is spaced from a particular reference point along the apparatus's optical path in a direction that is contrary to the direction of propagation of radiant energy through the apparatus. "Upstream" can also refer to the direction contrary to the propagation of radiant energy along the apparatus's optical path.

Figure 1:
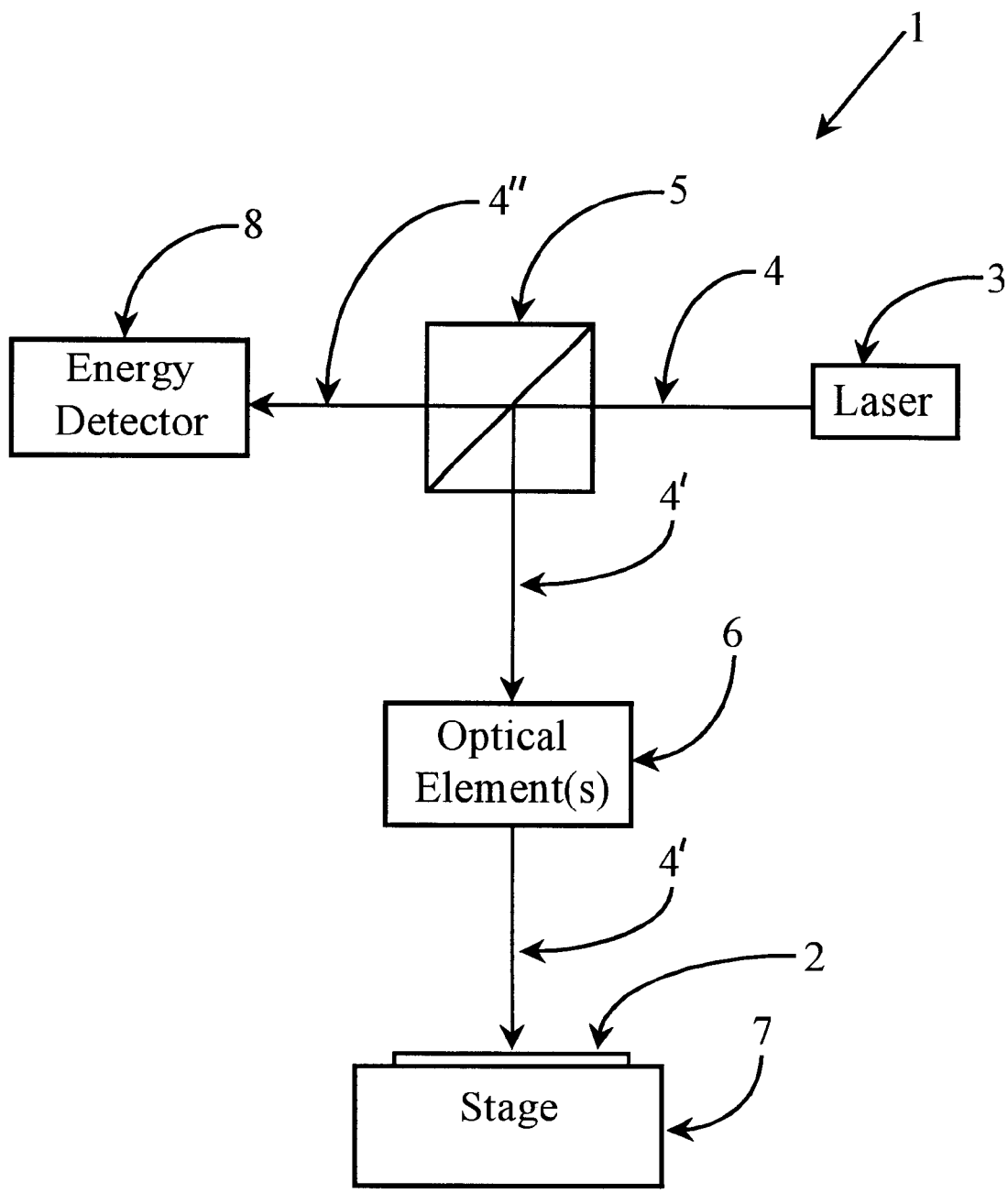
FIG. 1 is a block diagram of a previous device for monitoring radiant energy delivered to a substrate.
Figure 2:
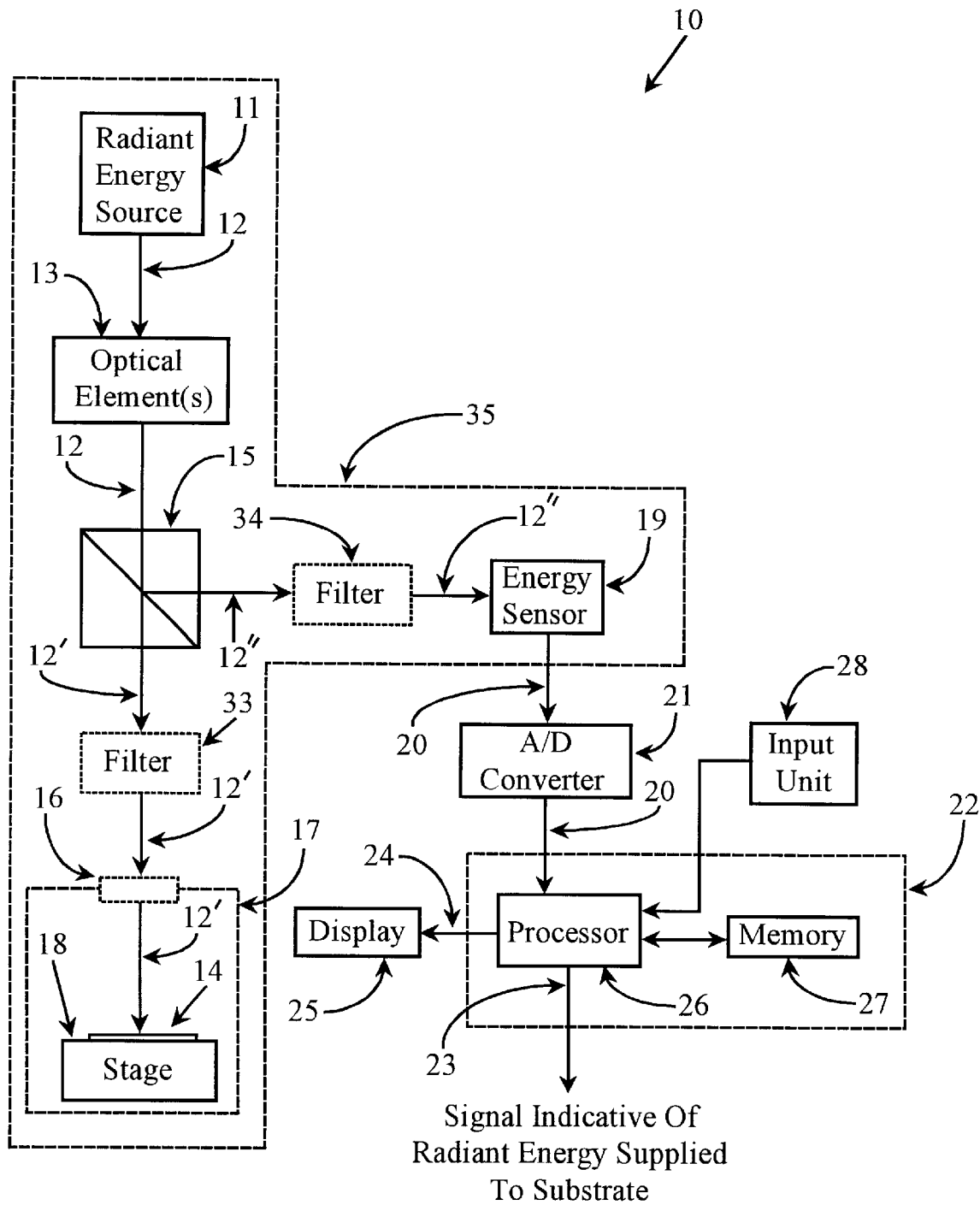
FIG. 2 is a block diagram of the invented apparatus in its operation mode.

In FIG. 2, an apparatus 10 of this invention, is shown. The apparatus 10 can include a source 11 which generates radiant energy 12. For example, the source 11 can be implemented as a laser, flash-lamp, or other device. The apparatus 10 can also include at least one optical element 13 arranged to receive radiant energy 12 from the source 11. The optical element(s) 13 modify the radiant energy 12 in a predetermined fashion. For example, the optical element(s) 13 can be configured as a projection system for lithography or annealing treatments in the manufacture of integrated devices and circuits. The optical element(s) 13 can include an arrangement of one or more lenses and/or mirrors to modify the radiant energy 12, such as by focusing the radiant energy onto the substrate 14 or a resist, semiconductor, insulator, or conductor layer formed thereon. The optical element(s) 13 can also modify the radiant energy 12 by magnifying or reducing the radiant energy's field, to expose a predetermined portion of the substrate 14 or a layer situated thereon. Moreover, the optical element(s) 13 can include a mask reticle for modifying the radiant energy 12 by selectively blocking and passing the radiant energy in accordance with the mask pattern. The resulting patterned radiant energy can be used to selectively expose the substrate 14 or a layer disposed thereon. In addition, the optical element(s) 13 could include one or more filters for passing predetermined wavelengths of radiant energy and not others. The optical element(s) 13 can also include other elements than those specially disclosed herein, as will readily occur to those of ordinary skill in this technology.

The apparatus 10 includes an energy-tapping member 15 arranged to receive the radiant energy 12 from the optical element(s) 13. The energy-tapping member 15 can be implemented as a beam splitter, for example. The energy-tapping member 15 divides the radiant energy 12 received from the optical element(s) 13 into first and second portions 12', 12" so that the energies of the first and second portions 12', 12" are related. In other words, the second portion of radiant energy 12" can be used to derive the first portion of radiant energy 12' in the apparatus's operational mode without having to directly sense the radiant energy 12' at the position of the substrate 14. This feature of the invented apparatus is particularly advantageous in applications in which the presence of a sensor at the substrate position in an apparatus's operational mode would result in disturbance or blockage of the radiant energy 12', or would not be possible due to the presence of caustic reactants in a reaction chamber which would attack such sensor, for example. The specific manner in which the radiant energy 12' can be derived from the radiant energy 12" will be described later in this document.

The first portion of radiant energy 12' travels from the energy-tapping member 15 to the substrate 14. For example, the substrate 14 can be a semiconductor substrate such as silicon (Si), gallium arsenide (GaAs), or other semiconductor material, or an insulative substrate upon which a thin layer of semiconductor material is formed (e.g., silicon-on-insulator (SOI) or silicon-on-sapphire (SOS) substrates). The substrate 14 can also be a transparent substrate or "blank" with a layer of radiant-energy-absorbing material such as chromium and overlying resist layer, that are to be patterned to form a mask reticle for use in photolithography. The substrate 14 can also be a workpiece to be micro-machined to form a micro-mechanical (MM) or micro-electromechanical (MEM) part, for example. Substrate 14 can also be glass, such as those used to fabricate flat panel displays. In an exemplary application, the first portion of radiant energy 12' can be used to expose a resist layer on the substrate 14 which can be developed to selectively expose portions of the substrate or semiconductor (e.g., silicon), conductor (e.g., metal), or insulator (e.g., silicon oxide or silicon nitride) layers formed thereon, which are to be subjected to a process step. Such process step can include selective doping with n-type or p-type impurities to change the conductivity of the substrate or semiconductor layers disposed on the substrate in exposed regions thereof to form source, drain, gate or channel regions of integrated devices thereon, for example. The process step can also include selective etching of the substrate or layers formed thereon through chemical etchants or high-energy ions (e.g., reactive ion etching), or selective deposition of reaction products on the substrate 14 or layers formed thereon (e.g., through the use of various chemical vapor deposition (CVD) techniques). In another exemplary application, the first portion of radiant energy 12' can also be used to anneal source and drain regions of integrated devices formed on the substrate 14 or layers disposed thereon. The radiant energy 12' could also be used to anneal electrical contacts between semiconductor regions of the substrate 14 or layers situated thereon, and metal lines and wiring. The first portion of radiant energy 12' can also be used to pattern a resist layer for use in micro-machining a workpiece substrate 14 through ion milling, for example. Moreover, the first portion of the radiant energy 12' can be used to supply radiant energy 12' to trigger a chemical reaction, for example, by directing the first portion of the radiant energy through a window 16 formed in a chamber 17 containing the substrate 14 and chemical reactants which dope, etch or form deposition products upon on the substrate 14 or layers formed thereon upon exposure to the first portion of radiant energy. The window 16 and the chamber 17 are indicated in broken line to denote that they are optional elements which can be included in the apparatus 10, but which can also be omitted in applications in which they are not needed.

The energy-tapping member 15 is positioned between the optical element(s) 13 and the substrate 14. It should be appreciated that because the member 15 is positioned downstream along the optical path from the optical element(s) 13, variations in the positioning and performance of the optical element(s) 13 such as mechanical or thermal drift, have no significant impact on the relationship between the first and second portions of radiant energy 12', 12". This is in marked contrast to previous devices which are highly vulnerable to drift in the optical elements with which such devices are used. In the invented apparatus, it is preferred that the energy-tapping member 15 be positioned in the apparatus 10 so that it is the last element, or at least as near as possible to the last element, encountered by the radiant energy 12 before the first portion of it travels to the substrate 14. By tapping the second portion of radiant energy 12" relatively close to the substrate 14 in terms of the apparatus's optical path, the actual amount of radiant energy 12' delivered to the substrate can be determined from the second (or tapped) portion of radiant energy 12" with relative accuracy. In some applications, however, it can be desirable to position the energy-tapping member 15 relatively close to the substrate 14 along the apparatus's optical path, but not as the last element. For example, it may be desirable in the performance of a pre-specified process step for treating the substrate 14 with the radiant energy 12' to direct such radiant energy through the window 16 in the process chamber 17 to the substrate 14 positioned therein. In this circumstance, it may be preferable to position the energy-tapping member 15 upstream of the process chamber window 16 to avoid subjecting the energy-tapping member to chamber reactants and/or temperature or pressure conditions which could adversely impact its performance. Nonetheless, whether the energy-tapping member 15 is the last element along the apparatus's optical path or not, by positioning the energy-tapping member 15 downstream from the optical element(s) 13, a major improvement over previous devices and techniques for radiant-energy treatment of a substrate or layers formed thereon, can be obtained.

To position the substrate 14 to receive the first portion of radiant energy 12', the apparatus 10 can include a stage 18. The stage 18 can be one of a wide variety of commercially-available devices, preferably one capable of positioning the substrate 14 in two- or three-dimensions. The stage 18 can be positioned and fixed within the process chamber 17 to support the substrate 14, or can be fixed to a suitable support surface, for example.

The apparatus 10 includes an energy sensor 19 arranged to receive the second portion of radiant energy 12" from the energy-tapping member 15. The energy sensor 19 can include a photodiode, an array of photodiodes, or other suitable device. The photodiode(s) can be a p-i-n ("PIN") diode(s), for example. The energy sensor 19 generates an electric sensor signal 20, based on the second portion of radiant energy 12". The apparatus 10 can include an analog-to-digital (A/D) converter 21 coupled to receive the sensor signal 20 from the energy sensor 19, to convert the sensor signal 20, if necessary, from analog to digital form.

The apparatus 10 also can include a processing unit 22 coupled to receive the sensor signal 20 from the A/D converter 21 (or from the energy sensor 19 if such A/D converter is not used). The processing unit 22 basically functions to generate a signal 23 indicative of the first portion of radiant energy 12' supplied to the substrate 14, based on the sensor signal 20. The signal 23 can be output to a processor or computer external to the apparatus 10, for example, for the purpose of generating data for a series of parameters of the radiant energy 12', such as the amount of energy, wavelength, number of shots (i.e., pulses), pulse length, etc. applied to the substrate 14, and whether such parameters resulted in satisfactory or unsatisfactory processing of the substrate 14 with the radiant energy 12'.

The processing unit 22 can also function to generate a display signal 24, based on the sensor signal 20. The apparatus 10 can include a display unit 25 coupled to receive the display signal 24 from the processing unit 22, to generate a visual display indicative of the radiant energy 12' delivered to the substrate 14, or the amount of such radiant energy delivered to the substrate over a predetermined time or radiant energy pulse(s), for example.

In one embodiment, the processing unit 22 can include a processor 26 and a memory 27. The processor 26 can be a microprocessor or microcontroller, for example. The memory 27 can be a random-access memory (RAM) or a hard disk drive. However, the processor and memory are not limited to the specific devices disclosed herein as numerous substitutes can be used, as will readily occur to those of ordinary skill in the art. The processor 26 is coupled to receive the sensor signal 20, and is also coupled to the memory 27. The processor 26 can perform processing as directed by a control program prestored in the memory 27 before calibration and operation of the apparatus 10. The apparatus 10 can include an input unit 28 such as a keyboard or other device, coupled to the processing unit 22, or more specifically, the processor 26. The input device 28 can be used by a human or machine operator to input the processor's control program and predetermined data for storage in the memory 27. The predetermined data can include time increment data used by the processor 26 to determine the rate at which the processor samples the sensor signal 20 to generate sample data. The time increment data is preferably predetermined so that the processor 26 can obtain several samples of the sensor signal during a pulse of radiant energy 12, and can be from tenths or hundredths of a nanosecond to seconds, for example, generally depending upon the pulse length of the radiant energy required for treatment of the substrate or layers formed thereon, and the constancy of the source 11. In general, if the pulse length is relatively short or radiant energy generated by source 11 varies relatively greatly, the time increment is preferred to be relatively short. Conversely, if the pulse length is relatively long and the radiant energy 12 relatively invariant over the duration of a radiant energy pulse generated by the source 11, the time increment can be relatively long.

The predetermined data input to the memory 27 via the input unit 28 can also include predetermined threshold data used by the processor 26 to determine whether radiant energy 12 is being generated by the source 11. In other words, if the processor 26 determines that the level of sample data generated by sampling the sensor signal 30 exceeds the threshold data level, a pulse of radiant energy 12 is deemed by the processor to be in progress, and the processor converts the sample data level into an energy data level which is stored by the processor in the memory 27, preferably in correspondence with the time increment in which the sample was taken, and possibly also the sample data itself. The processor 26 converts the sample data level into an energy data level, based on predetermined relationship data that is stored in the memory 27 before the apparatus's operational mode. The predetermined relationship data relates the sample data level to the energy data level which is the amount of radiant energy 12' provided to the substrate 14 for the respective time increment. The derivation of the predetermined relationship data that relates the sample data to energy data levels will be described later in this document with reference to FIGS. 3 and 4. If the processor 26 determines that the sample data level is at or below the threshold data level, the processor 26 does not perform the sample-data-to-energy-data conversion. The use of the threshold data level thus reduces the data processing burden on the processor 26.

The predetermined data can further include time period data used by the processor 26 to determine that a series of pulses of radiant energy 12' has ended. More specifically, if the processor 26 determines that the sample data level from the sensor signal 20 has fallen below the threshold data level for longer than the predetermined time period, it can safely be assumed that the radiant energy 12' is no longer being applied to the substrate 14. Conversely, if the sample data levels have not fallen to or below the threshold data level for the predetermined time period, a series of pulses of radiant energy 12' cannot as yet be deemed to have stopped because the drop in the sample data level to or below the threshold data level can be caused by the fact that the source 11 is in a non-activated state between generation of pulses for a substrate processing step that is as yet still in progress. After the processor determines that a pulse(s) of radiant energy 12' has ended by expiration of the predetermined time period, the processor 26 can be preprogrammed to integrate or sum the energy data corresponding to the sample data for the radiant energy pulses(s) stored in the memory 27, to generate the signal 23 indicative of the amount of energy applied to substrate 14. By using the predetermined time period data, the processor 26 is preprogrammed to wait for the end of a substrate treatment involving a series of pulses before determining the amount of radiant energy 12' that was applied to the substrate. Alternatively, however, the processor 26 can be preprogrammed to perform summations of the energy data on a per pulse basis, for example, in response to the energy data level falling below the threshold data level, to generate the signal 23 to be indicative of the amount of radiant energy 12' contained in each of a series of radiant energy pulses applied to the substrate 14.

The apparatus 10 can include a filter 33 arranged between the energy-tapping member 15 and the substrate 14, and a filter 34 arranged between the energy-tapping member 15 and the energy sensor 19. The filters 33, 34 can be used to reject background illumination of the same character such as room or sun light, for example, from reaching the substrate 14 and energy sensor 19, respectively. The filters 33, 34 can be used in applications in which the substrate 14 or radiant-energy processing thereof could be adversely affected by ambient light. The filters 33, 34 can also be used in an application in which the radiant energy wavelength generated by the source 11, is significantly present in ambient light to which the energy sensor 19 could be sensitive. The apparatus 10 can include a support member 35 such as a table or chassis, to hold at least the source 11, the optical element(s) 13, the energy-tapping member 15, the stage 18, the chamber 17 (if used), the energy sensor 19, and the filters 33, 34 (if used), in a substantially fixed relationship relative to one another. Although not shown in the Figures, the apparatus 10 can include clamps or the like to mount appropriate elements of the apparatus 10 to the support member 35.

To convert a sample data level(s) into a respective energy data level(s), the processing unit 22, or more specifically, the processor 26, uses predetermined relationship data prestored in the memory 27 before the apparatus's operational mode. The predetermined relationship data relates the sample data level indicative of the second portion of radiant energy 12", and the energy data level which represents the actual radiant energy 12' applied to the substrate 14. This predetermined relationship data can be determined in the apparatus's calibration mode, as now described with reference to FIG. 3.

Figure 3:
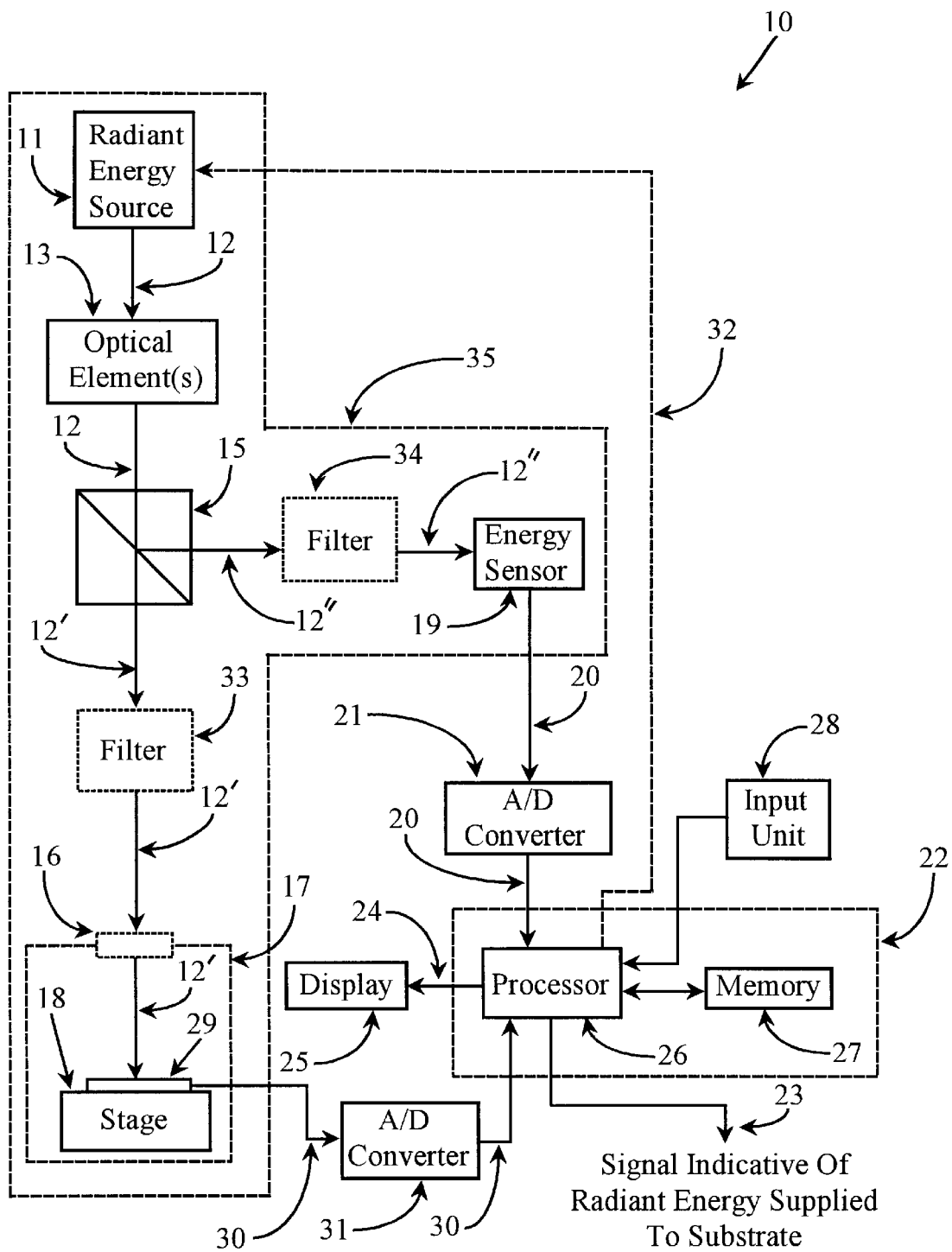
FIG. 3 is a block diagram of the invented apparatus in its calibration mode.

As shown in FIG. 3, the apparatus 10 can include an energy sensor 29 which is the same or similar type of device as the energy sensor 19, for example. The energy sensor 29 is positioned on the stage 18 in place of the substrate 14. The energy sensor 29 generates an electric energy data signal 30, based on the radiant energy 12'. The apparatus 10 can include an analog-to-digital (A/D) converter 31 coupled to receive the energy data signal from the energy sensor 29. The A/D converter 31 converts the energy data signal from analog to digital form. The A/D converter 31 is coupled to output the energy data signal in digital form to the processing unit 22, or more specifically, to the processor 26. However, the energy sensor 29 can be coupled to supply the energy data signal 30 to the processing unit 22 without the intermediate A/D converter 31 if the processing unit 22 can accept the energy data signal in the form output by the energy sensor 29. The processor 26 can be coupled to supply an increment signal 32 to the source 11 to vary the radiant energy 12 generated by the source, and the processor 26 compiles and stores corresponding sample data and energy data levels for different radiant energies 12 to compile the predetermined relationship data that relates levels of the sample data 20 and the energy data 30. That is, the processor 26 generates a data list that is stored in the processing unit 22, or more specifically, the memory 27, which relates the sample data levels to respective energy data levels for various radiant energies. Preferably, the sample data levels and corresponding energy data levels are compiled using a range of radiant energies which covers the energies expected to be used to process the substrate 14. In its operational mode, the processing unit 22 (or processor 26) can convert a particular sample data level into a corresponding energy data level by using the prestored relationship data as a look-up table or index. For example, the processing unit 22 can use the sample data level as an address supplied to memory 27 which reads out of the addressed memory location the corresponding prestored energy data level. Alternatively, the processing unit 22 can be preprogrammed to use the predetermined relationship data to derive a function that relates the range of possible or expected sample data levels to corresponding energy data levels. The function derived from the relationship data can be prestored in the memory 27 and used by the processor 26 in its operational mode to determine the energy data level for a particular sample data level. The function can be derived by a well-known least-squares fit of the sample data levels to the energy data levels compiled in the apparatus's calibration mode. Although the processor 26 can generate the increment signal 32 to vary the radiant energy 12 generated by the source 11, the source radiant energy could be varied manually or by an external controller in which case the processor 26 need not generate the increment signal 32.

Figure 4:
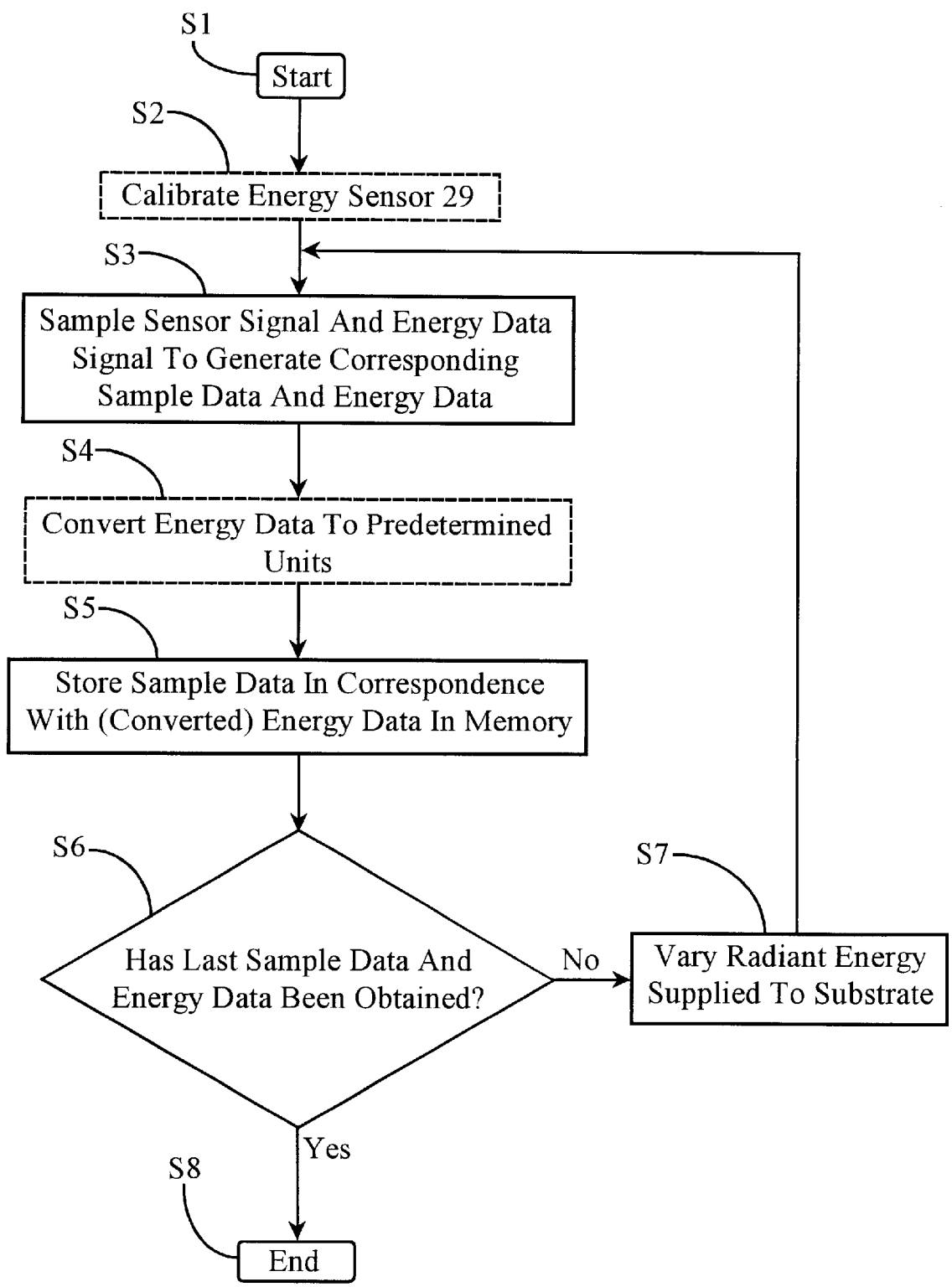
FIG. 4 is flow chart of processing performed by the processing unit in its calibration mode.

FIG. 4 is a flow chart of processing performed by the processing unit 22, or more specifically, the processor 26, in its calibration mode. In step S1, the processing performed by the processor 26 in calibration mode begins. In step S2, the energy sensor 29 can be calibrated to generate its energy data signal 30 based on the radiant energy incident thereto at a level corresponding to predetermined units of energy such as Joules or electron-volts. Alternatively, the energy sensor 29 can be such that it requires no calibration to generate the energy data signal 30 with a level corresponding to predetermined energy units. Accordingly, step S2 is indicated in broken line to indicate that it is an optional step. As yet another alternative, the energy sensor 29 can be calibrated by preprogramming the processing unit 22 to convert levels of the energy data signal 30 from the energy sensor 29 into energy data levels in predetermined units of energy, over the range of radiant energies that could possibly be used or are expected to be used to treat the substrate 14 or layers formed thereon. This can be accomplished by preprogramming the processing unit 22 to relate levels of the energy data signal 30 generated by the energy sensor 29 over a range of predetermined known radiant energies to be used to treat the substrate 14 or layers formed thereon, to energy data input via unit 28 which indicates such known radiant energies in predetermined units of energy. Preferably, the known radiant energies are applied directly from source 11 (or other source) to the sensor 29 without any intervening optical element(s) so that it can be assured that such sensor is detecting the known energies, and not energies modified by the presence of such optical element(s). Also preferred, the known radiant energies used to preprogram the processing unit 22 are generated by the source 11 at wavelengths and under otherwise similar conditions as are to be used to treat the substrate 14 or layers formed thereon. After calibration of the energy sensor 29 (if necessary), in step S3, the source 11 is activated to generate radiant energy 12. The processor 26 samples the level of the sensor signal 20 to generate sample data, and also samples the level of the energy data signal 30 to generate energy data indicative of the radiant energy received by the energy sensor 29 at the position that the substrate 14 is to occupy on the stage 18. To ensure proper functioning of the apparatus 10, preferably, the optical lengths traveled by the first and second portions of radiant energy 12', 12" to the substrate 14 and energy sensor 19, respectively, are fixed and substantially identical in the apparatus's calibration mode as well as its operational mode, and the processor 26 samples the sensor signal 20 and the energy data signal 30 substantially simultaneously so that the sample and energy data are as closely related as possible within the accuracy limits of the apparatus 10. In step S4, the processor 26 converts the level of the energy data signal 30 into energy data in predetermined units of energy based on its optional preprogramming in step S2 (thus, step S4 is illustrated in broken line in FIG. 4 to indicate that it is an optional step). In step S5, the processor 26 stores the energy data level in correspondence with the sample data level in the memory 27, optionally after conversion to predetermined energy units in step S4. Step S5 can be performed, for example, by storing the energy data level at a location in the memory 27 whose address corresponds to the level of the sample data. Accordingly, in the operational mode, if the processor samples the sensor signal 20 to generate actual sample data, and supplies the actual sample data level as an address to the memory 27, the memory will output the corresponding energy data level to the processor 26, optionally in converted form as a result of the performance of step S4. In step S6, the processor 26 determines whether the last sample data level and energy data level have been taken. In other words, the processor 26 determines whether a predetermined number of samples of the sensor signal 20 and energy data signal 30 have been taken to provide a prespecified degree of accuracy to generate the predetermined relationship data over the expected dynamic range of the radiant energy 12', that is, from the lowermost level of radiant energy 12' at approximately zero (0) Joules to the uppermost level of radiant energy 12' that could possibly or reasonably be expected to be delivered to the substrate 14 under prespecified objectives for the substrate processing. In step S6, if the last sample has not been taken, processing performed by the processor 26 proceeds to step S7 in which the radiant energy 12' generated by the source 11 and supplied to the substrate 14, is varied. Such variation can be accomplished by the processor 26 automatically by activating the increment signal 32 supplied to the radiant energy source 11. Based on the activation of the increment signal 32 by the processor 26, the source 11 increments the level of the radiant energy 12 by a predetermined energy increment. Thereafter, processing performed by the processor 26 returns to step S3. On the other hand, if the processor 26 determines in step S6 that the last sample data level and energy data level pair have been obtained, in step S8, processing performed by the processor 26 in its calibration mode terminates.

In preparation for the operational mode, the elements of the apparatus 10 are of course properly positioned and aligned, and the source 11 is set to deliver a predetermined radiant energy, number of shots, pulse length, fluence, etc., features which are inherent in commercially-available lasers. Also, in preparation for the operational mode, the processing unit 22 is activated to begin monitoring the sensor signal 20. The processing performed by the processing unit 22, or more specifically, the processor 26, in its operational mode, is now described with reference to FIG. 5.

Figure 5:
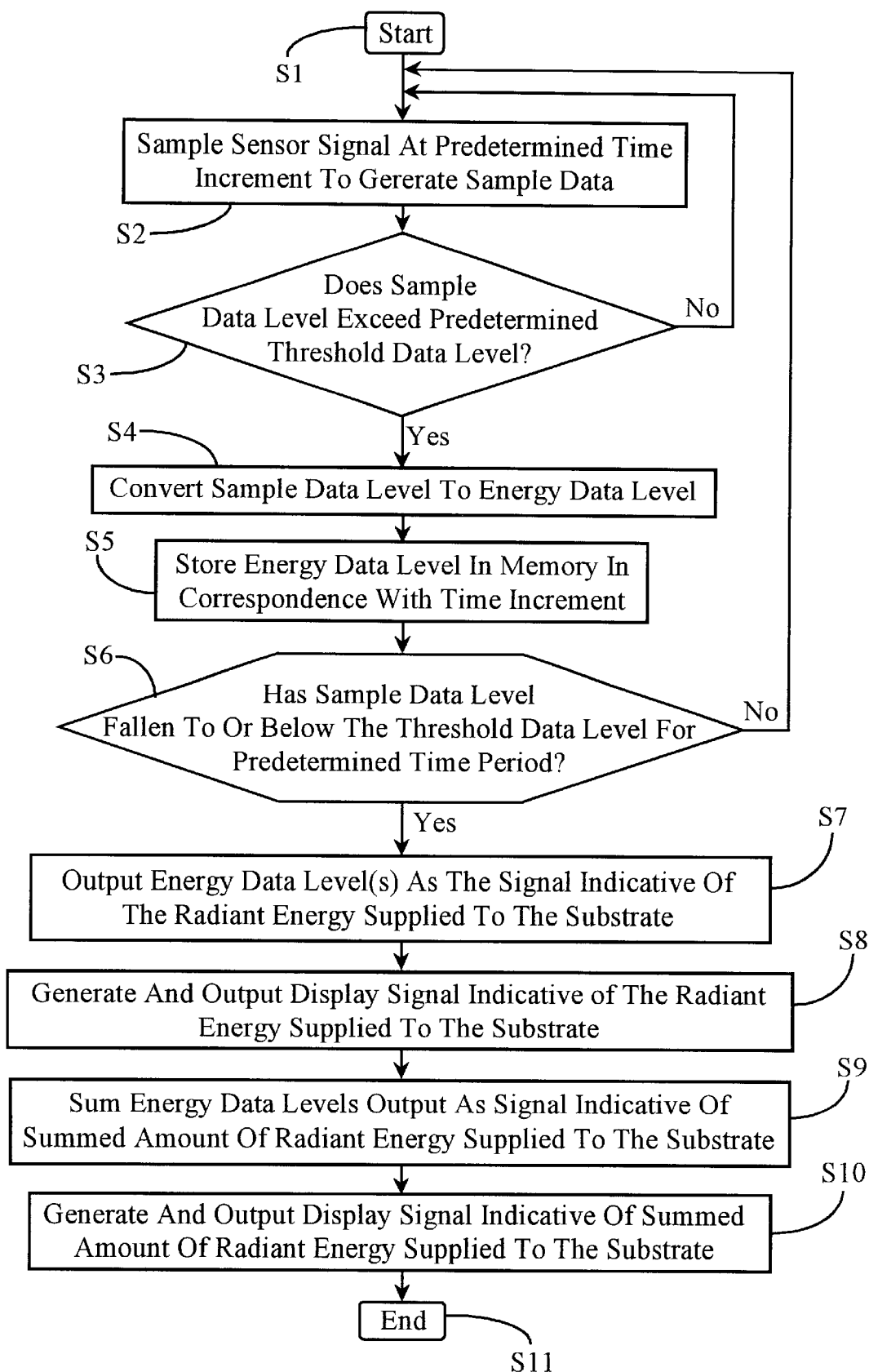
FIG. 5 is a flow chart of processing performed by the processing unit of the invented apparatus in its operation mode.

In step S1 of FIG. 5, the processing performed by the processing unit 22 begins. In step S2, the processor 26 samples the sensor signal 20 at the predetermined time increment to generate sample data. In step S3, the processor 26 determines whether the level of the sample data exceeds the predetermined threshold data level. If not, processing returns to step S2. On the other hand, if the determination in step S3 is affirmative, processing proceeds to step S4 in which the processor 26 uses the predetermined relationship data stored in the memory 27 as a result of the performance of the calibration mode to convert the sample data level into an energy data level. In step S5, the processor 26 stores the energy data level read out from the memory 27 back into such memory in a different memory space than that containing the predetermined relationship data, in correspondence with the respective time increment to which the energy data level pertains. In step S6, the processor 26 determines whether the sample data level has fallen to or below the threshold data level for the predetermined time period. If not, processing returns to step S2. On the other hand, if the determination in step S6 is affirmative, processing proceeds to step S7 in which the processor 26 reads and outputs the energy data level(s) stored in the memory 27, as the signal 23 indicative of the radiant energy 12' supplied to the substrate 14. Optionally, the processor 26 can output the energy data level(s) as the signal 23 in correspondence with the time increments to which they pertain. The processor 26 can be programmed or be commanded by activation of the input unit 28 to output operator-specified energy data levels for respective time increments, for example. In step S8, the processor 26 can generate and output a display signal 24 indicative of the radiant energy supplied to the substrate. The display signal 24 can be used to generate a graphical display on the unit 25 of energy versus time increment, for example, to show the actual pulse width(s) and strength(s) of radiant energy 12' applied to the substrate 14 in a processing step. In step S9, the processor 26 sums the energy data levels over a predetermined time such as the duration(s) of the radiant energy pulse(s) used for treatment. The processor outputs the resulting sum as the signal 23 which in this case is indicative of the summed or integrated amount of energy supplied to the substrate 14. In step S10, the processor 26 generates and outputs the display signal 24, which in this case is based on the summed energy data level(s) indicative of the summed amount of radiant energy 12' supplied to the substrate 14. In step S11, processing performed by the processor 26 in its operational mode terminates.

Figure 6:
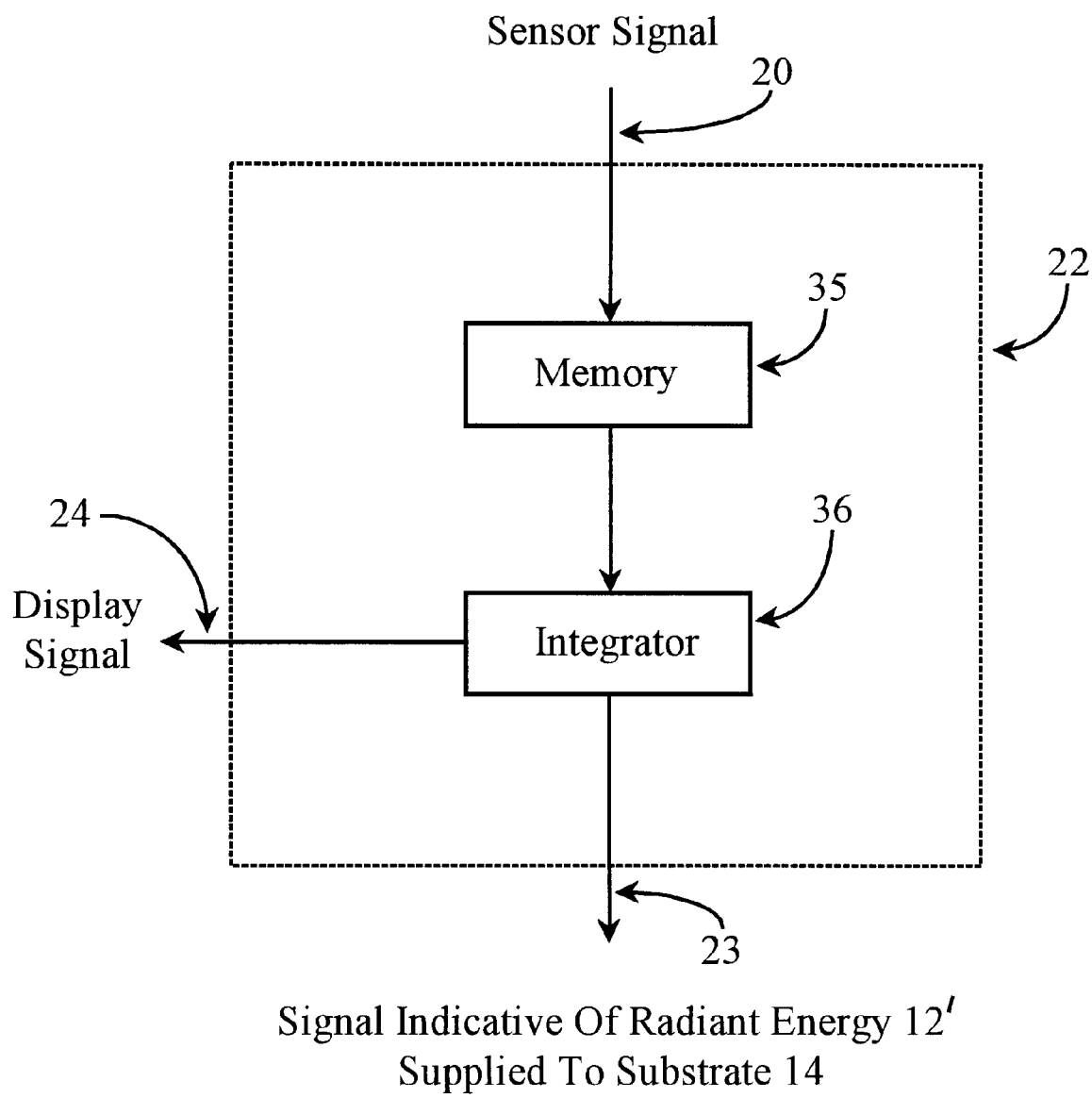
FIG. 6 is a block diagram of an alternative embodiment of the processing unit of the invented apparatus which includes a memory and an integrator.

FIG. 6 is an alternative embodiment of processing unit 22. In FIG. 6, processing unit 22 includes a memory 35 and an integrator 36. Memory 35 is coupled to receive sensor signal 20 either from energy sensor 19 or A/D converter 21 (if used). Memory 35 is programmed with the predetermined relationship data established in the calibration mode of apparatus 10. Memory 35 can be implemented as a look-up table to generate an energy data level based on the level of sensor signal 20. Integrator 36 can be coupled to receive the energy data from memory 35. Integrator 36 integrates the energy data to generate signal 23 that is indicative of the amount of radiant energy 12' supplied to substrate 14. Integrator 36 can also generate a display signal, based on the signal indicative of the amount of radiant energy 12' supplied to substrate 14 over a predetermined time such as the duration of a radiant energy pulse or series of pulses.

Figure 7:
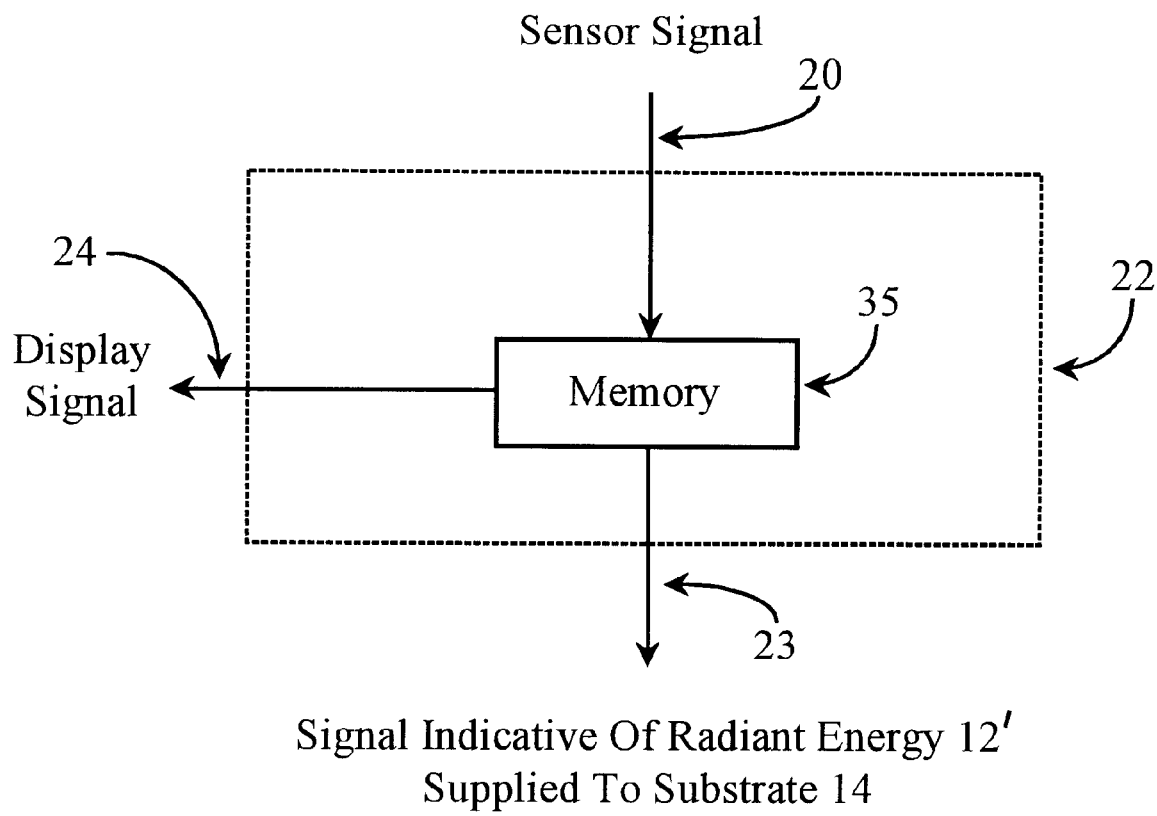
FIG. 7 is a block diagram of an alternative embodiment of the processing unit of the invented apparatus which includes a memory.

FIG. 7 is another alternative embodiment of processing unit 22. In FIG. 7, processing unit 22 includes memory 35. Memory 35 is coupled to receive sensor signal 20 either from energy sensor 19 or A/D converter 21 (if used). Memory 35 is programmed with the predetermined relationship data established in the calibration mode of apparatus 10. Memory 35 can be implemented as a look-up table to generate an energy data level based on the level of sensor signal 20. The energy data level can be output from memory 35 as signal 23, or as display signal 24.

It should be appreciated that, in addition to or in lieu of generating the signals 23, 24 in predetermined units of energy (e.g., Joules), the apparatus 10 can be readily adapted to output the signals 23, 24 in predetermined units of fluence (e.g., Joules per square centimeter) delivered to the substrate 14 or layer formed thereon. This can be readily done in numerous ways that will readily occur to those of ordinary skill in this technology. For example, the energy sensor 29 can either be inherently capable or can be calibrated in step S2 of FIG. 4 to output the energy data signal 30 in predetermined units of fluence in the apparatus's calibration mode to generate predetermined relationship data that relates levels of the sample data derived from the sensor signal 20, to respective energy data levels in fluence units. Accordingly, in the apparatus's operational mode, the sample data can be converted in step S4 of FIG. 5 into energy data levels in fluence units. Alternatively, the processing unit 22 can be preprogrammed to convert sample data levels derived from the sensor signal 20 into energy data levels in predetermined fluence units by preprogramming the processing unit 22 to relate levels of the energy data signal 30 generated under predetermined known fluences expressed as data in fluence units, over the range of fluences that could possibly be used or is expected to be used to treat the substrate (or layer formed thereon) based on pre-specified objectives. By establishing the relationship of the levels of the energy data signal 30 to predetermined fluence units as well as the relationship of levels of the sensor signal 20 to the levels of the energy data signal 30, the processing unit 22 can be programmed with predetermined relationship data relating levels of the sensor signal 20 to energy data expressed in predetermined fluence units. Hence, in the performance of step 54 of FIG. 5 in the apparatus's operational mode, the processor 22 can generate the energy data in fluence units. Accordingly, in the following claims, it should be understood that the energy data, signal 23 indicative of the radiant energy or amount of radiant energy supplied to the substrate 14, and the display signal 24 indicative of the radiant energy or amount thereof supplied to the substrate, for example, can be generated by the processing unit 22 to express the radiant energy in fluence units, as well as energy units, or in any other units as may occur to persons of ordinary skill in this technology.

The many features and advantages of the present invention are apparent from the detailed specification and thus, it is intended by the appended claims to cover all such features and advantages of the described apparatuses and methods which follow in the true spirit and scope of the invention. Further, since numerous modifications and changes will readily occur to those of ordinary skill in the art, it is not desired to limit the invention to the exact construction and operation illustrated and described. Accordingly, all suitable modifications and equivalents may be resorted to as falling within the spirit and scope of the claimed invention.

What is claimed is:

1. An apparatus for monitoring radiant energy generated by a source and delivered through a radiant energy modifying optical element to a substrate without further radiant energy modification, the apparatus comprising:
   an energy-tapping member disposed intermediate said optical element and said substrate to receive said radiant energy from said optical element, and dividing the received radiant energy into a first portion and a second portion with said first portion passing through said energy-tapping member to said substrate;
   an energy sensor arranged to receive said second portion of said radiant energy from said energy-tapping member, and to generate a sensor signal; and
   a processing unit coupled to said energy sensor to receive said sensor signal for comparison with relationship data between said first and second portions of said radiant energy generated during a calibration operation of said apparatus to provide an indication of the radiant energy intensity of said first portion of said radiant energy delivered to said substrate, based on said second portion of said radiant energy.

2. An apparatus as claimed in claim 1, wherein said energy-tapping member includes a beam splitter.

3. An apparatus as claimed in claim 1, wherein said energy sensor includes at least one PIN diode.

4. An apparatus as claimed in claim 1, further comprising:
   a support member to support at least said source, said optical element, said energy-tapping member, and said energy sensor.

5. An apparatus as claimed in claim 1, wherein said processing unit integrates said sensor signal over a predetermined time to generate a signal indicative of an amount of radiant energy supplied to said substrate.

6. An apparatus as claimed in claim 1, wherein said processing unit includes:
   a processor coupled to receive said sensor signal; and
   a memory coupled to said processor, said memory preprogrammed during said calibration operation with said relationship data, said processor generating a signal indicative of the radiant energy supplied to the substrate, based on the sensor signal and the relationship data.

7. An apparatus as claimed in claim 1, wherein the processing unit includes:
   a processor coupled to receive the sensor signal; and
   a memory coupled to the processor and being preprogrammed with predetermined time increment data, predetermined threshold data, and predetermined relationship data relating a level of said first portion of said radiant energy delivered to said substrate to a level of said sensor signal,
   said processor sampling said sensor signal based on a predetermined time increment data to generate sample data, said processor comparing a level of said sample data to said predetermined threshold data level, and determining whether a level of said sample data exceeds said predetermined threshold data level,
   if said processor determines that said sample data level exceeds said predetermined threshold data level, said processor converts said sample data level into an energy data level, based on said sample data and said relationship data.

8. An apparatus as claimed in claim 7, wherein, after said processor determines said sample data level exceeds said threshold data level, said processor compares at least one subsequent sample data level with said threshold data level to determine whether said subsequent sample data level has fallen to or below said threshold data level,
   if said processor determines that said subsequent sample data level has fallen to or below said threshold data level, said processor integrates said energy data to generate a signal indicative of said amount of said first portion of radiant energy supplied to said substrate.

9. An apparatus as claimed in claim 7, wherein said memory is preprogrammed with predetermined time period data, and wherein, after said processor determines said sample data level exceeds said threshold data level, said processor compares subsequent sample data level with said threshold data level to determine whether said sample data level has fallen to or below said threshold data level for said predetermined time period,
   if said processor determines that said subsequent sample data level has fallen to or below said threshold data level for said predetermined time period, said processor integrates said energy data to generate a signal indicative of said amount of said first portion of radiant energy supplied to said substrate.

10. An apparatus as claimed in claim 1, wherein said processing unit includes:
    a memory coupled to receive said sensor signal from said energy sensor, said memory preprogrammed with a look-up table including said relationship data, said memory generating a signal indicative of said radiant energy supplied to said substrate, based on said sensor signal and said relationship data.

11. An apparatus as claimed in claim 10, wherein said processing unit further includes:
    an integrator coupled to receive from said memory said signal indicative of said radiant energy supplied to said substrate, said integrator integrates said signal indicative of said radiant energy supplied to said substrate to generate a signal indicative of said amount of radiant energy supplied to said substrate.

12. An apparatus as claimed in claim 1, wherein:
    said processing unit generates a display signal indicative of said radiant energy supplied to said substrate,
    said apparatus further comprising:
    a display unit coupled to receive said display signal from said processor, and generating a visual display indicative of radiant energy supplied to said substrate, based on said display signal.

13. An apparatus as claimed in claim 1, further comprising:
    an optical filter positioned between said energy-tapping member and said substrate, for filtering background illumination from said first portion of radiant energy supplied to said substrate.

14. An apparatus as claimed in claim 1, further comprising:
    an optical filter positioned between said energy-tapping member and said energy sensor, for filtering background illumination from said second portion of radiant energy supplied to said energy sensor.

15. An apparatus as claimed in claim 1, further comprising:
    an analog-to-digital (A/D) converter coupled to receive said sensor signal from said energy sensor, for converting said sensor signal from analog to digital form, said A/D converter coupled to supply said sensor signal in digital form to said processing unit.

16. An apparatus as claimed in claim 1, further comprising:
a stage for holding said substrate in a position to receive said first portion of radiant energy from said energy-tapping member.

17. An apparatus as claimed in claim 16, further comprising:
an additional energy sensor positioned on said stage in place of said substrate during said calibration operation of said apparatus, said additional energy sensor coupled to said processing unit, said additional energy sensor generating an energy data signal indicative of said radiant energy received at a position to be occupied by said substrate on said stage, said processor generating said relationship data by relating said sensor signal to said energy data signal for a set of radiant energies generated by said source.

18. An apparatus as claimed in claim 1, wherein said energy-tapping member is the last element encountered by said radiant energy along said apparatus's optical path before said first portion of radiant energy proceeds to said substrate.

19. An apparatus as claimed in claim 4, wherein said support member includes a table.

20. An apparatus as claimed in claim 4, wherein said support member includes a chassis to enclose said source, said optical element, said energy-tapping member, and said energy sensor.

21. An apparatus for monitoring radiant energy delivered to a substrate, said apparatus comprising:
a radiant energy source;
a radiant energy modifying optical element arranged to receive radiant energy generated by said source;
an energy-tapping member arranged to receive said radiant energy modified by said optical element, and to divide said received radiant energy into a first portion that travels from said energy-tapping member to said substrate and a second portion;
an energy sensor arranged to receive said second portion of the modified radiant energy from said energy-tapping member, and to generate a sensor signal; and
a processing unit coupled to said energy sensor to receive said sensor signal for comparison with relationship data between said first and second portions of said radiant energy generated during a calibration operation of said apparatus to provide an indication of the radiant energy intensity of said first portion of said radiant energy delivered to said substrate, based on said second portion of said radiant energy.

22. An apparatus as claimed in claim 21, further comprising:
a stage for holding said substrate in a position to receive said first portion of radiant energy from said energy-tapping member.

23. An apparatus as claimed in claim 21, wherein said source includes a laser.

24. An apparatus as claimed in claim 21, wherein said source includes a flash lamp.

25. An apparatus as claimed in claim 21, wherein said optical element includes at least one mirror.

26. An apparatus as claimed in claim 21, wherein said optical element includes at least one lens.

27. An apparatus as claimed in claim 21, wherein said energy-tapping member includes a beam splitter.

28. An apparatus as claimed in claim 21, wherein said energy-tapping member is the last element encountered by said radiant energy along the apparatus's optical path before said first portion of radiant energy proceeds to said substrate.

29. An apparatus as claimed in claim 21, wherein said processing unit integrates a signal indicative of said radiant energy supplied to said substrate over a predetermined time to generate a signal indicative of said amount of radiant energy supplied to said substrate.

30. An apparatus as claimed in claim 29, wherein:
said processing unit uses said signal indicative of said amount of radiant energy supplied to said substrate to generate a display signal; and
said apparatus further comprising:
a display unit coupled to receive said display signal from said processor, and to generate a visual display indicative of said amount of energy supplied to said substrate based on said display signal.

31. An apparatus as claimed in claim 22, further comprising:
an additional energy sensor positioned on said stage in place of said substrate during said calibration operation of said apparatus, said additional energy sensor coupled to said processing unit, said additional energy sensor generating an energy data signal indicative of said radiant energy received at a position to be occupied by said substrate on said stage, said processor generating said relationship data by relating said sensor signal to said energy data signal for a set of radiant energies generated by said source.

32. A method of generating and monitoring radiant energy, said method comprising the steps of:
a) generating and directing radiant energy to an optical element;
b) modifying said radiant energy with said optical element;
c) dividing said radiant energy from said optical element into first and second portions, said first portion of said radiant energy proceeding to said substrate for treatment thereof;
d) sensing said second portion of radiant energy, and generating a sensor signal based on said sensed second portion of said radiant energy; and
e) comparing said sensor signal with relationship data between said first and second portions of said radiant energy generated during a calibration operation to provide an indication of said first portion of radiant energy supplied to said substrate.

33. A method as claimed in claim 32, wherein said sensor signal is generated in said step (d) further based on said relationship data relating the level of said second portion of radiant energy represented by said sensor signal to said first portion of radiant energy supplied to said substrate.

34. A method as claimed in claim 32, further comprising the step of:
f) positioning said substrate on a stage to receive said first portion of radiant energy from said energy-tapping member.

35. A method as claimed in claim 32, further comprising the step of:
f) integrating said sensor signal to generate a signal indicative of an amount of radiant energy supplied to said substrate.

36. A method as claimed in claim 32, further comprising the steps of:
f) sampling said sensor signal to generate sample data;
g) relating a level of said sample data to an energy data level indicative of said first portion of radiant energy based on said relationship data relating levels of said first and second portions of radiant energy; and h) generating a signal indicative of said first portion of radiant energy supplied to said substrate, based on said energy data level.

37. A method as claimed in claim 32, further comprising the steps of:

f) sampling said sensor signal to generate sample data;

g) relating a level of said sample data to an energy data level indicative of said first portion of radiant energy, based on said relationship data relating levels of said first and second portions of radiant energy;

h) repeatedly performing said steps (f) and (g) over a time period; and i) integrating said energy data levels over said time period to generate a signal indicative of said amount of radiant energy supplied to said substrate.

38. A method as claimed in claim 32, further comprising the step of:

f) generating a visual display, based on said sensor signal.

39. A method of monitoring radian energy generated by a source and delivered through a radiant energy modifying optical element to a substrate without further energy modification, said method comprising the steps of:

a) dividing radiant energy received from said optical element into first and second portions at a position immediately upstream of said substrate with respect to a direction of propagation of said radiant energy;

b) sensing said second portion of said radiant energy, and generating a signal indicative of said second portion of radiant energy; and c) comparing said sensor signal with relationship data between said first and second portions of said radiant energy generated during a calibration operation to provide and indication of said first portion supplied to said substrate based on said second portion of radiant energy.

40. A method as claimed in claim 39, further comprising the step of:

d) positioning said substrate to receive said first portion of radiant energy.

41. A method as claimed in claim 39, further comprising the steps of:

d) placing an energy sensor at a location of said substrate to sense said first portion of radiant energy and initiating a calibration operation;

e) sensing said first portion of radiant energy;

f) sensing said second portion of radiant energy;

g) varying said radiant energy level;

said steps (d) through (f) being repeatedly performed, and h) generating relationship data relating said first portion of radiant energy sensed in said step (e) and said second portion of radiant energy sensed in said step (f), said steps (d) through (h) performed before said step (c), said relationship data used in said step (c) to generate said signal indicative of said first portion of radiant energy delivered to said substrate.

42. A method as claimed in claim 39, wherein said sensor signal is generated in said step (b) further based on predetermined relationship data relating said sensor signal to said first portion of radiant energy supplied to said substrate.

* * * * *